United States Patent
Wu et al.

(10) Patent No.: US 7,755,081 B2
(45) Date of Patent: *Jul. 13, 2010

(54) DIELECTRIC MATERIALS FOR ELECTRONIC DEVICES

(75) Inventors: Yiliang Wu, Mississauga (CA); Beng S. Ong, Mississauga (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 55 days.

This patent is subject to a terminal disclaimer.

(21) Appl. No.: 11/558,015

(22) Filed: Nov. 9, 2006

(65) Prior Publication Data
US 2007/0085113 A1    Apr. 19, 2007

Related U.S. Application Data

(63) Continuation of application No. 10/982,472, filed on Nov. 5, 2004, now Pat. No. 7,170,093.

(51) Int. Cl.
*H01L 35/24* (2006.01)
(52) U.S. Cl. .............. 257/40; 257/59; 257/72; 257/E29.278; 257/51.028; 257/51.035
(58) Field of Classification Search .......... 257/E51.028, 257/E51.035, 40
See application file for complete search history.

(56) References Cited

U.S. PATENT DOCUMENTS

| | | | |
|---|---|---|---|
| 4,753,855 A * | 6/1988 | Haluska et al. ........... 428/702 |
| 6,524,967 B1 | 2/2003 | Alluri | |
| 6,621,099 B2 | 9/2003 | Ong et al. | |
| 6,770,904 B2 | 8/2004 | Ong et al. | |
| 6,774,393 B2 | 8/2004 | Murti et al. | |
| 6,846,755 B2 | 1/2005 | Kloster et al. | |
| 6,949,762 B2 | 9/2005 | Ong et al. | |
| 7,170,093 B2 * | 1/2007 | Wu et al. ................. 257/59 |
| 7,265,377 B2 * | 9/2007 | Kubota et al. ............ 257/40 |
| 2005/0110149 A1 | 5/2005 | Osaka et al. | |

OTHER PUBLICATIONS

Dimitrakopoulos, C.D. and Malenfant, P.R.L., Organic Thin Film Transistors for Large Area Electronics, Adv. Mater., vol. 12, No. 2, pp. 99-117 (2002).

* cited by examiner

*Primary Examiner*—Kenneth A Parker
*Assistant Examiner*—Jose R Diaz
(74) *Attorney, Agent, or Firm*—Eugene O. Palazzo; Fay Sharpe LLP

(57) ABSTRACT

A dielectric material prepared from a siloxy/metal oxide hybrid composition, and electronic devices such as thin film transistors comprising such dielectric material are provided herein. The siloxy/metal oxide hybrid composition comprises a siloxy component such as, for example, a siloxane or silsesquioxane. The siloxy/metal oxide hybrid composition is useful for the preparation of dielectric layers for thin film transistors using solution deposition techniques.

6 Claims, 2 Drawing Sheets

DIELECTRIC MATERIALS FOR ELECTRONIC DEVICES

CROSS-REFERENCE TO RELATED APPLICATIONS

This application is a continuation of U.S. patent application Ser. No. 10/982,472, filed Nov. 5, 2004, titled "DIELECTRIC MATERIALS FOR ELECTRONIC DEVICES," now U.S. Pat. No. 7,170,093, issued Jan. 30, 2007. That application is hereby fully incorporated by reference.

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND

The present disclosure relates, in various exemplary embodiments, to electronic devices, including microelectronic devices, and materials suitable for use in such devices. More specifically, the present disclosure relates to devices that incorporate siloxy/metal oxide hybrid compositions or materials in the dielectric layers for such devices as thin film transistors.

Thin film transistors are fundamental components in modern-age electronics, including, for example, sensor, imaging, and display devices. Thin film transistor circuits using current mainstream silicon technology may be too costly, particularly for large-area device applications such as backplane switching circuits for displays like active matrix liquid crystal monitors or televisions, where high switching speeds are not essential. The high costs of silicon-based thin film transistor circuits are primarily due to the capital-intensive silicon fabrications as well as the complex high-temperature, high-vacuum photolithographic fabrication processes under strictly controlled environments.

Because of the cost and complexity of fabricating silicon-based thin film transistor circuits using conventional photolithography processes, there has been an increased interest in plastic thin film transistors which can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To enable the use of these solution-based processes in fabricating thin film transistor circuits, solution processable materials are therefore required.

Most of the current materials research and development activities for plastic thin film transistors has been devoted to semiconductor materials, particularly solution-processable organic and polymer semiconductors. On the other hand, other material components such as solution processable dielectric materials have not been receiving much attention.

For plastic thin film transistor applications, it is desirable to have all the materials be solution processable. It is also highly advantageous that the materials be fabricated on plastic substrates at a temperature of less than about 200° C., and particularly less than about 150° C. The use of plastic substrates, together with flexible organic or polymer transistor components can transform the traditional thin film transistor circuits on rigid substrates into mechanically more durable and structurally flexible plastic thin film transistor circuit designs. Flexible thin film transistor circuits will be useful in fabricating mechanically robust and flexible electronic devices.

Other than solution processable semiconductor and conductor components, solution processable dielectric materials are critical components for the fabrication of plastic thin film transistor circuits for use in plastic electronics, particularly flexible large-area plastic electronics devices.

Generally, the dielectric layer which serves as the gate dielectric in a thin film-transistor should i) be a smooth uniform layer without pinholes, ii) have a high dielectric constant to enable the thin film transistor to operate at lower voltages, and iii) have no adverse effects on the transistor's performance. Additionally, for flexible integrated circuits on plastic substrates, the dielectric layer should be prepared at temperatures that would not adversely affect the dimensional stability of the plastic substrates, i.e., generally less than about 200° C., preferably less than about 150° C.

A wide variety of organic and polymer materials, including polyimides [Z. Bao, et al. *J. Chem. Mater.* 1997, Vol. 9, pp 1299.], poly(vinylphenol) [M. Halik, et al. *J. Appl. Phys.* 2003, Vol 93, pp 2977.], poly(methyl methacrylate) [J. Ficker, et. al. *J. Appl. Phys.* 2003, Vol 94, 2638.], polyvinylalcohol [R. Schroeder, et. al. *Appl. Phys. Lett.* 2003, Vol 83, pp 3201.], poly(perfuoroethylene-co-butenyl vinyl ether) [J. Veres, et al. *Adv. Funct. Mater.* 2003, Vol 13, pp 199.]], and benzocyclobutene [L. -L. Chua, et. al. *Appl. Phys. Lett.* 2004, Vol 84, 3400.], have been studied as dielectric layers. These materials, however, do not generally meet all the economic and/or functional requirements of low-cost thin film transistors. In particular, most of the organic or polymer dielectric materials generally have low dielectric constants, and thus cannot enable low-voltage electronic devices.

Therefore, it is desirable to provide a dielectric material composition that is solution processable and which composition can be used in fabricating the gate dielectric layers of thin film transistors It is equally desirable to provide a dielectric material that will permit easy fabrication of a gate dielectric layer for thin film transistors by solution processes, that is pinhole free, has a high dielectric constant, and exhibits electrical and mechanical properties that meet the device physical and performance requirements. It is also desirable to provide a material for fabricating the dielectric layer for thin film transistors that can be processed at a temperature compatible with plastic substrate materials to enable fabrication of flexible thin film transistor circuits on plastic films or sheets.

BRIEF DESCRIPTION

The present disclosure provides, in various exemplary embodiments, in one aspect, a dielectric material suitable for microelectronic device applications like thin film transistor devices.

In another aspect, there is provided a solution processable dielectric material composition suitable for use in electronic devices such as thin film transistors.

A further aspect relates to a dielectric material composition comprising a siloxy/metal oxide hybrid composition for use in electronic devices.

In yet a further aspect of the present disclosure, there are provided siloxy/metal oxide hybrid compositions which are useful as microelectronic components, and which compositions have good solubility of, for example, at least about 0.5 percent by weight in a solvent, such as methylene chloride, methanol, ethanol, propanol, butanol, methyl ethyl ketone, methyl isobutylketone, tetrahydrofuran, toluene, xylene, mesitylene, chlorobenzene, and the like, and thus these components can be used in fabricating dielectric components for electronic devices via solution processes such as spin coating, solution casting, dip coating, stencil/screen printing, flexography, gravure, offset printing, jet-printing, micro-contact printing, and the like, and a combination of these processes.

In a further aspect, there is provided a thin film transistor comprising a substrate, a gate electrode, a gate dielectric layer, a source electrode, a drain electrode and a semiconductor layer, wherein the gate dielectric layer comprises a siloxy/metal oxide composition comprising a siloxy component and a metal oxide component, the siloxy component being selected from the group consisting of siloxanes and silsesquioxanes.

In yet another aspect, there is provided a thin film transistor comprising a gate electrode, a dielectric layer, a source electrode, a drain electrode, and a semi-conductor layer. The dielectric layer comprises a siloxy/metal oxide composition, the siloxy composition comprises a siloxy component selected from the group consisting of siloxanes, silsesquioxanes, and combinations thereof, and a metal oxide component comprising a metal selected from the group consisting of titanium, aluminum, zirconium, hafnium, tantalum, strontium, yttrium, lanthanum, and combinations thereof, and an oxygen component selected from the group consisting of methoxy, ethoxy, propoxy, isopropoxy, butoxy, tert-butoxy, sec-butoxy, phenoxy and combinations thereof. The dielectric layer has a dielectric constant of greater than about 3.0.

Also provided is a thin film transistor comprising a substrate, a gate electrode, a gate dielectric layer comprising a siloxy/metal oxide hybrid composition, wherein the siloxy/metal oxide hybrid composition comprises a siloxy component present in an amount of from about 5 to about 95 percent by weight, and a metal oxide component present in an amount of from about 5 to about 95 percent by weight such that the combined amount of siloxy and metal components equal 100 percent by weight of the siloxy/metal oxide hybrid composition, excluding the amounts of solvents that may be present in the composition. A source electrode, a drain electrode, and a semiconductor layer in contact with the source and drain electrodes is also provided, wherein the dielectric layer has a dielectric constant of greater than about 3 and a capacitance of greater than about 3 $nF/cm^2$.

These and other non-limiting aspects and/or features of the present disclosure are more particularly described below.

BRIEF DESCRIPTION OF THE DRAWINGS

The following is a brief description of the drawings, which are presented for the purposes of illustrating the disclosure set forth herein and not for the purposes of limiting the same.

DETAILED DESCRIPTION

Figure 1:
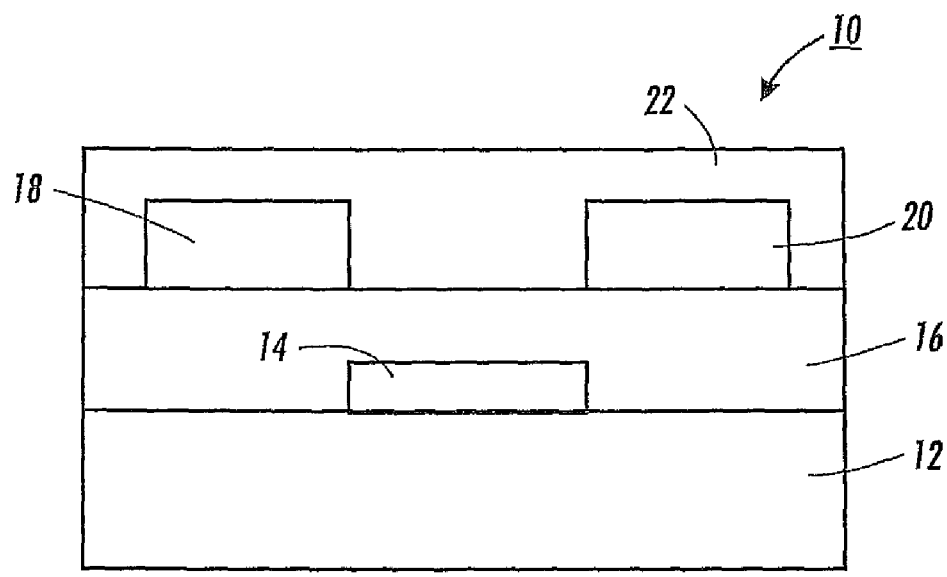
FIG. 1 is a cross-sectional view that schematically illustrates a thin film transistor according to one embodiment of the present disclosure.

Generally, a thin film transistor comprises three electrodes (a gate electrode, a source electrode and a drain electrode), a gate dielectric layer, sometimes referred to as an insulating layer, a semiconductor layer, a supporting substrate, and an optional encapsulation layer.

FIGS. 1-4 are illustrative embodiments of suitable thin film transistor structural configurations for use in the present disclosure. FIGS. 1-4 are merely illustrative of possible configurations for the various layers of a thin film transistor and are not intended to be limiting in any manner.

Although specific terms are used in the following description for the sake of clarity, these terms are intended to refer only to the particular structure of the embodiments selected for illustration in the drawings, and are not intended to define or limit the scope of the disclosure.

With reference to FIG. 1, a thin film transistor 10 includes a substrate 12, a gate electrode 14 in contact with substrate 12, and a dielectric layer 16 formed over the substrate and the gate electrode. Two metal contacts, source electrode 18 and drain electrode 20, are deposited on top of the dielectric layer 16. Over and between the metal contacts 18 and 20 is a semiconductor layer 22.

Figure 2:
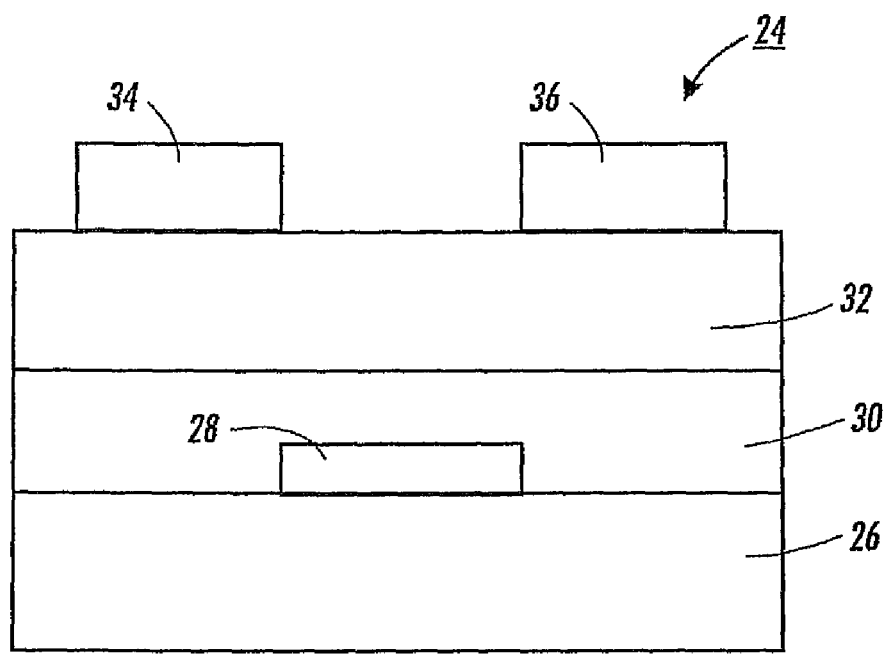
FIG. 2 is a cross-sectional view that schematically illustrates a thin film transistor according to a second embodiment of the present disclosure.

With reference to FIG. 2, thin film transistor configuration 24 includes a substrate 26 over which is applied a gate electrode 28 and a dielectric layer 30. Semiconductor layer 32 is deposited over dielectric layer 30. Thin film transistor 24 also includes source electrode 34 and drain electrode 36.

Figure 3:
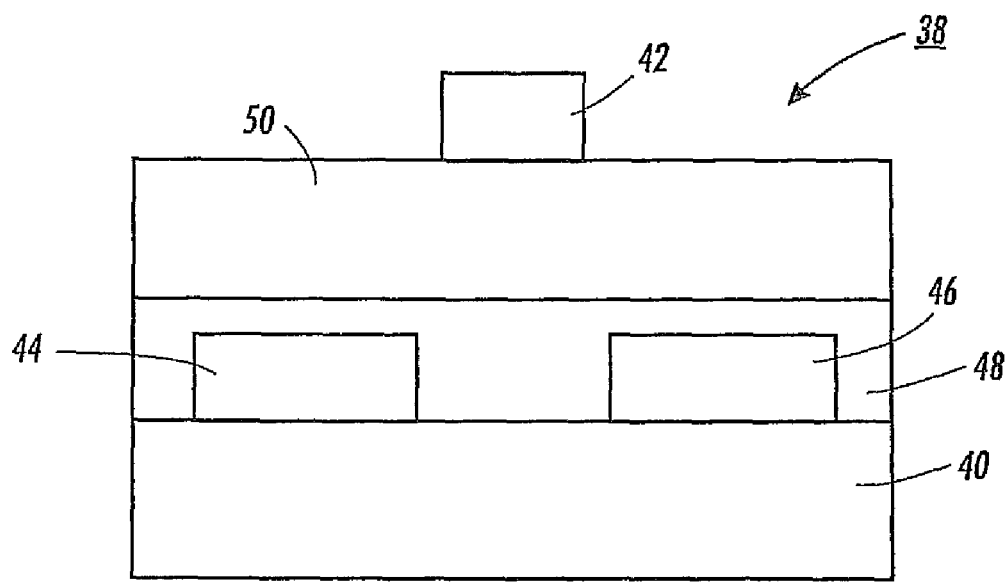
FIG. 3 is a cross-sectional view that schematically illustrates a thin film transistor according to a third embodiment of the present disclosure.

With reference to FIG. 3, another embodiment of a thin film transistor is illustrated. Thin film transistor 38 includes substrate 40, gate electrode 42, source electrode 44, drain electrode 46, a semiconductor layer 48 and a dielectric layer 50.

Figure 4:
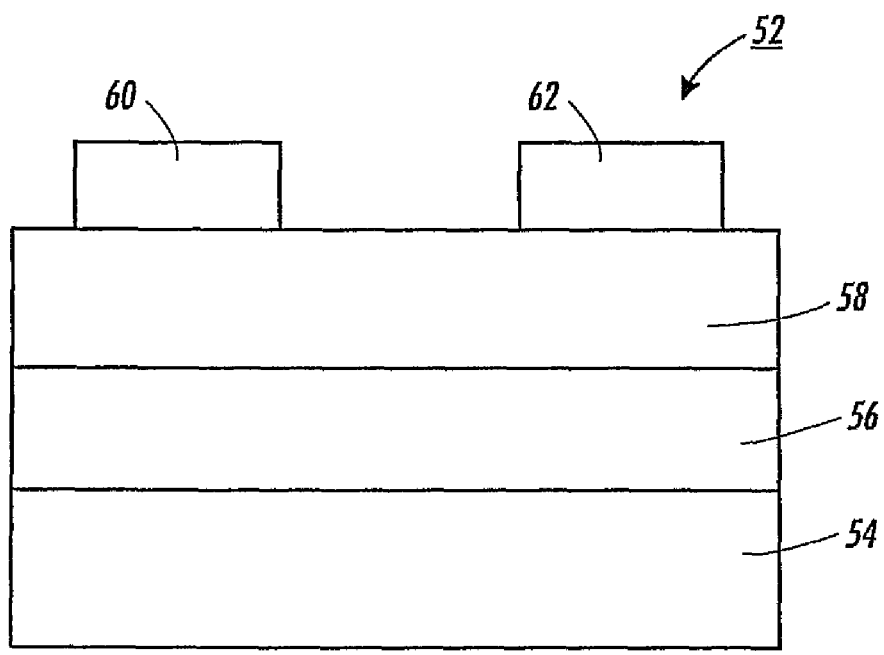
FIG. 4 is a cross-sectional view that schematically illustrates a thin film transistor according to a fourth embodiment of the present disclosure.

With reference to FIG. 4, a thin film transistor 52 includes a heavily n-doped silicon wafer 54, which acts as a gate electrode, a dielectric layer 56 disposed on the n-doped silicon wafer, a semiconductor layer 58, and source electrode 60 and drain electrode 62 disposed on the semiconductor layer 58.

In some embodiments of the present disclosure, an optional protecting layer may also be included. For example, such an optional protecting layer may be incorporated on the top of each of the transistor configurations of FIGS. 1-4.

Electronic devices such as thin film transistors according to the present disclosure include a dielectric material prepared from the siloxy/metal oxide hybrid composition. As used herein, the term siloxy refers to a material comprising silicon and oxygen elements, including, for example, siloxanes and silsesquioxanes. Generally, the siloxy component may be unsubstituted or substituted. The siloxy component may, in embodiments, be an alkyl, alkenyl, alkoxyl, aryl, or aryloxy substituted siloxane or silsesquioxane.

Materials suitable as the siloxy component include, but are not limited to siloxanes and silsesquioxanes. Siloxanes, as used herein refer to materials generally having a repeating unit represented by the formula $(R_2SiO)_n$. Silsesquioxanes, as used herein refers to materials generally represented by the formula $(SiR)_{2n}O_{3n}$. For each of the general formulas for the siloxanes and silsesquioxanes, n represents the number of repeating units. Generally, the R groups for each of the siloxanes and silsesquioxanes may be independently selected from the group consisting of hydrogen, alkyl, $C_1$-$C_{20}$ aliphatic, $C_4$-$C_{20}$ alicyclic, arylalkyl, alkenyl, alkoxyl, aryl, or aryloxy, and combinations thereof. Examples of suitable solixanes include, but are not limited to hexamethyldisiloxane and octamethyltrisiloxane. Non-limiting examples of suitable silsesquioxanes include hydrogen silsesquioxane (HSQ), methylsilsesquionxane (MSQ), hydrido-organo silsesquioxane (HOSQ), and the like, and combinations thereof.

The metal oxide component of the siloxy/metal oxide hybrid composition is, in embodiments, an oxide of titanium, aluminum, zirconium, hafnium, tantalum, strontium, yttrium, lanthanum and mixtures thereof. In embodiments, the oxygen containing portion of the metal oxide may comprise oxygen alone. Examples of suitable metal oxides include, but are not limited to, $TiO_2$, $ZrO_2$, $Al_2O_3$, $La_2O_3$, $Y_2O_3$, $Ta_2O_5$, $HfO_2$, and the like. In other embodiments, the oxygen containing portion may be methoxy, ethoxy, propoxy, isopropoxy, butoxy, pentoxy, phenoxy, and the like, and combinations thereof. In some embodiments, the metal oxide component is generated by hydrolyzing the corresponding metal oxide precursors. For example, $TiO_2$ component could be incorporated in the siloxy/metal oxide compositions via in-situ hydrolysis of the corresponding precursor of titaniumisopropoxide.

The siloxy component is present in the siloxy/metal oxide composition in an amount of from about 5 to about 95 percent by weight, and the metal oxide component is present in an amount of from about 5 to about 95 percent by weight such that the combined amount of silyoxy and metal oxide components equals 100 percent by weight of the siloxy/metal oxide hybrid composition, excluding the amounts of solvents that may be present in the composition. In embodiments, the ratio of the siloxy to the metal oxide in the composition is from about 19:1 to about 1:19.

The siloxy/metal oxide hybrid compositions are suitable for use in fabricating dielectric layers for electronic devices such as thin film transistors. The siloxy/metal oxide hybrid compositions are solution processable, and therefore can be processed by low cost solution fabrication methods. Further, the present siloxy/metal oxide hybrid compositions may be processed at temperatures of less than about 200° C., and, in embodiments, less than about 150° C. Consequently, the present siloxy/metal oxide hybrid compositions are processable at temperatures which are compatible with many commercial plastic substrates, such as MYLAR®, PEN®, and the like, and may be used in the fabrication of flexible thin film transistor circuits.

The dielectric layer may be any thickness suitable for use in a thin film transistor. In embodiments, the dielectric layer has a thickness of from about 50 nanometers to about 2 micrometers. In other embodiments the dielectric layer has a thickness of from about 200 nanometers to about 1 micrometer.

The dielectric layers formed from the present siloxy/metal oxide hybrid compositions exhibit many desirable features. For example, the dielectric layers formed from the present siloxy/metal oxide hybrid compositions are generally pinhole free. Additionally, the dielectric layers have high dielectric constants, and thus high breakdown voltages. Generally, the dielectric layer prepared from the present siloxy/metal oxide hybrid composition has a dielectric constant greater than about 3.0. In other embodiments, the dielectric constant is greater than about 4.0. These dielectric constants are higher than the dielectric constants of the dielectric layers prepared from the siloxane compositions alone. Without being bound to any particular theory, it is believed that the increase in the dielectric constant comes from the incorporation of metal oxide. The relatively high dielectric constant allows the thin film transistor to operate at lower operating voltages. The dielectric constant may be desirably adjusted by tuning the ratio of the siloxy component and the metal oxide component in the composition.

The dielectric layers formed from siloxy/metal oxide hybrid compositions as described herein exhibit electrical and mechanical properties suitable for use in thin film transistors. In embodiments, the dielectric layer has a capacitance of greater than about 3 $nF/cm^2$. In other embodiments, the dielectric layer has a capacitance of greater than about 6 $nF/cm^2$. In further embodiments, the dielectric layer has a capacitance of greater than about 10 $nF/cm^2$. In still other embodiments, the dielectric layer exhibits a capacitance of from about 15 to about 25 $nF/cm^2$. The capacitance of the dielectric layer is a function of the thickness of the dielectric material. When the dielectric constant is maintained or held constant, the capacitance decreases as the thickness of the dielectric layer increases. Dielectric layers of similar thicknesses, however, will exhibit different capacitances based on the dielectric constant of the respective materials. Generally, at the same thickness, the capacitance of the dielectric layer increases as the dielectric constant increases.

The dielectric layers formed from siloxy/metal oxide hybrid compositions as described herein have a very smooth surface. The surface roughness of the said dielectric layer may be for example less than about 50 nanometers in one embodiment, 10 nanometers in another embodiment, and less than about 1 nanometers in still other embodiments.

Siloxy/metal oxide hybrid compositions may be prepared by any suitable method known in the art. Generally, the siloxy/metal oxide hybrid composition is prepared in solution, and is utilized as a "prepolymer" for the fabrication of dielectric layers for use in electronic devices such as thin film transistors. In embodiments, the siloxy/metal oxide hybrid composition has good solubility in common solvents such as ketones, esters, alcohols, ether, and the like. In embodiments, the composition is prepared based on sol-gel chemistry. Specifically, the siloxy/metal oxide hybrid composition is, in embodiments, prepared by first reacting the siloxy component in an acidic solution, followed by reaction with the metal oxide component. In one embodiment, the siloxy/metal oxide hybrid composition is synthesized in a mixed solvent. The composition, in the embodiment, is not isolated from the solvent, but used as a solution for fabricating the dielectric layer.

The siloxy/metal oxide hybrid compositions as described herein are solution processable, and can be used in fabricating dielectric layers via solution deposition techniques including, but not limited to, spin coating, solution casting, dip coating, stencil/screen printing, flexography, gravure, offset printing, jet-printing, micro-contact printing, a combination of these processes, and the like.

The substrates in the present thin film transistors may be any suitable materials including, but are not limited to, silicon wafer, glass plate, a plastic film or sheet and the like depending on the intended applications. Other suitable materials include ceramic foils, coated metallic foils, acrylics, epoxies, polyamides, polycarbonates, polyimides, and polyketones. For structurally flexible electronic devices, a plastic substrate, such as, for example, polyester, polycarbonate, polyimide sheets, and the like, may be used. The thickness of the substrate may be from about 10 micrometers to over 10 millimeters, provided the required mechanical properties are satisfied for the intended applications. In embodiments, the substrate is from about 50 to about 100 micrometers. In embodiments with rigid substrates, such as glass or silicon, the substrate is from about 1 to about 10 millimeters.

The composition and formation of the dielectric layer is described herein.

The gate electrode is not limited in any manner and may be any useful conductive material. The gate electrode may be a thin metal film, a conducting polymer film, a conducting film made from conducting ink or paste, or the substrate itself (for example, heavily doped silicon). Examples of suitable gate electrode materials include, but are not limited to, aluminum, chromium, copper, gold, silver, nickel, palladium, platinum, tantalum, titanium, indium, tin oxide, conducting polymers, such as polystyrene sulfonate-doped poly(3,4-ethylenediox-ythiophene) (PSS-PEDOT), conducting ink/paste comprised of carbon black/graphite or colloidal silver dispersion in polymer binders, such as ELECTRODAG® available from Acheson Colloids Company and silver filled electrically conductive thermoplastic ink available from Noelle Industries, and the like. The gate electrode may be prepared, for example, by vacuum evaporation or by sputtering of metals or conductive metal oxides. They can also be prepared from conducting polymer solutions or conducting inks by spin coating, casting or printing. In embodiments, the gate electrode has a thickness of from about 10 nanometers to about 10 micrometers. In other embodiments, where, for example, the gate electrode is a metal film, the gate electrode is generally in the range of from about 10 to about 200 nanometers. In further embodiments, where, for example, the gate electrode is a polymer conductor, the thickness of the gate electrode is from about 1 to about 10 micrometers.

The source and drain electrode layer may be fabricated from materials that provide a low resistance ohmic contact to the semiconductor layer. Materials for use as source and drain electrodes include materials suitable as the gate electrode including, but not limited to, gold, nickel, aluminum, platinum, conducting polymers, and conducting inks. In embodiments, the source and drain electrode layers have a thickness of from about 40 nanometers to about 1 micrometer. In further embodiments, the thickness of the source and drain electrode layers is from about 100 to about 400 nanometeres. The source and drain electrodes may be applied or deposited by any suitable methods including, but not limited to, vacuum evaporation, sputtering of metals or conductive metal oxides, or solution deposition techniques such as by spin coating, casting or printing.

In embodiments, the electronic devices that include a dielectric layer prepared from the present siloxy/metal oxide hybrid compositions are thin film transistors which include an organic semiconductor layer. Material suitable for use as an organic semiconductor layer include acenes, such as anthracene, tetracene, pentacene, and substituted pentacenes, perylenes, fullerenes, phthalocyanines, oligothiophenes, and substituted derivatives thereof. In embodiments, the organic semiconductor layer is formed from a solution processable material. Examples of other suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer has a thickness of from about 10 nanometers to about 1 micrometer. In further embodiments, the organic semiconductor layer has a thickness of from about 30 to about 150 nanometers. In other embodiments the substrate layer has a thickness of from about 40 to about 100 nanometers.

The thin film transistors containing a dielectric layer prepared from the siloxy/metal oxide hybrid composition, have a semiconductor channel length of for example, from about 1 micrometers to about 5 millimeters, and a channel width of from about 50 micrometers to about 10 millimeters. The semiconductor channel length may be, in embodiments from about 1 micrometer to about 1 millimeter. In other embodiments, the semiconductor channel length is from about 1 micrometer to about 500 micrometers. In further embodiments, the channel length is from about 5 micrometers to about 200 micrometers. The thin film transistors containing a dielectric layer prepared from a siloxy/metal oxide hybrid composition, as described herein, have a ratio of channel width to channel length of for example from about 1 to about 10,000. In other embodiments, the ratio of channel width to channel length is for example from about 1 to about 1,000.

Transistors, as described herein, may be formed or fabricated by forming the respective layers as described herein to provide a transistor with a desired structural configuration.

The thin film transistors employing a dielectric layer prepared from a siloxy/metal oxide hybrid composition in accordance with the present disclosure exhibit satisfactory thin film transistor properties. In embodiments, the current on/off ratio of the transistors is greater than about 1,000, and in further embodiments, greater than about 10,000. The transistors exhibit a leakage current lower than about 1 nA, and, in embodiments, lower than about 50 pA. The transistors also show low residual current of about $10^{-10}$ A. The transistors using dielectric layers prepared from a siloxy/metal oxide hybrid composition in accordance with the present disclosure have a mobility that is, in embodiments, higher than about 0.001 $cm^2/V \cdot s$, and in further embodiments is higher than about 0.01 $cm^2/V \cdot s$.

The following examples describe exemplary embodiments of the present disclosure. These examples are merely illustrative, and in no way limit the present development to the specific materials, conditions or process parameters set forth therein. All parts and percentages are by volume unless otherwise indicated.

EXAMPLE 1

1) Preparation of Siloxy/titanium Oxide Precursor.

A siloxy/metal oxide hybrid composition was prepared using methyltrimethoxysilane as the siloxy component and titanium isopropoxide as the metal oxide component as follows:

A mixture of 0.88 grams of aq. 0.1 wt % hydrochloric acid solution and 5.13 grams of tetrahydrofuran was added dropwise to a mixture of 4.08 grams of methyltrimethoxysilane and 9.24 grams of methylisobutylketone in a 3-necked flask cooled with an ice bath over a period of 30 minutes with rigorous stirring under a dry atmosphere. The resulting mixture was allowed to warm to room temperature and held there for 5 minutes before being heated to 60° C. and held there for 3 hours. Subsequently, a solution of 5.68 grams of titaniumisopropoxide in 12.8 grams of tetrahydrofuran was added and the reaction mixture was maintained at 60° C. for an additional hour. Finally, a mixture of 18.0 grams of tetrahydrofuran and 0.081 grams of distilled water was added to the reaction mixture, which was then cooled to room temperature before being used in fabricating the dielectric layer.

2) Fabrication and Characterization of Thin Film Transistors

The above methyltrimethoxysilane/titaniumisoproxide composition was first diluted with 20 grams of methylisobutylketone, and filtered through a 0.2 micron filter. It was then spin coated on n-doped silicon wafer at a speed of 3000 rpm for one minute. The deposited film was cured at a temperature of 150° C., resulting in a dielectric film which had a thickness of around 200 nanometers as measured by a surface profile meter. The dielectric film displayed very smooth surface properties with a low surface roughness of about less than 1 nanometer.

To measure the capacitance, a gold electrode layer was vacuum evaporated on top of the dielectric layer. Using a capacitor meter, the capacitance was measured to be around 22 $nF/cm^2$. The dielectric constant of the dielectric layer was calculated to be about 5.0.

Thin film transistors with a dielectric layer prepared as above were fabricated as follows:

A polythiophene semiconductor layer (PQT) was deposited on top of the dielectric layer on n-doped silicon wafer substrate by spin coating. The semiconductor layer was dried and annealed in a vacuum oven at about 80° C. to about 145° C. for 30 minutes, and then cooled down to room temperature. Subsequently, a set of source/drain electrode pairs were vacuum evaporated on top of the resulting semiconductor layer through a shadow mask to form a series of thin film transistors with various dimensions.

The resulting transistors were evaluated using a Keithley 4200 Semiconductor characterization system. Thin film transistors with channel lengths of about 60 micron and channel widths of about 1000 microns were characterized by measuring the output and transfer curves. The devices turned on at around 0 volts and exhibited field-effect mobility of 0.076 $cm^2/V \cdot s$ and current on/off ratio of about 5,500.

EXAMPLE 2

1) Preparation of Siloxy/aluminum Oxide Precursor

A siloxy/aluminum oxide hybrid composition was prepared using methyltrimethoxysilane as the siloxy component and aluminum tri-sec-butoxide as the metal oxide component as follows:

2.46 g of aluminum tri-sec-butoxide was added to a mixture of 4.08 g of methyl trimethoxysilane and 9.24 g of methyl isobutylketone in a 3-neck flask under a dry atmosphere. The mixture was cooled with an ice bath before a mixture of 0.88 g of aq. 0.1 wt % hydrochloric acid solution and 20 mL of tetrahydrofuran was added over a period of 30 minutes with vigorous stirring. After 30 minutes, the reaction mixture was removed from the ice bath, heated to 60° C., and then stirred at this temperature for 3 hours. Subsequently, a mixture of 0.081 g of distilled water and 20 mL tetrahydrofuran was added in a dropwise manner. The reaction mixture was stirred for an additional 2 hours before cooling down to room temperature before use.

2) Fabrication and Characterization of Thin Film Transistors

A dielectric layer was prepared from the above siloxy/aluminum tri-sec-butoxide hybrid composition in accordance with the procedure of Example 1. The capacitance of the resulting dielectric layer, which had a thickness of 180 nanometers, was measured to be 20 $nF/cm^2$, and the dielectric constant was calculated to be 4.1. Thin film transistors were fabricated using the same procedure as in Example 1, except that siloxy/aluminum tri-sec-butoxide hybrid composition was used in fabricating the dielectric layer. Thin film transistors with channel lengths of about 60 microns and channel widths of about 1000 microns were characterized by measuring the output and transfer curves. The devices turned on at around 0 volts and exhibited field-effect mobility of 0.09 $cm^2/V \cdot s$, and current on/off ratio of 25,000.

EXAMPLE 3

1) Preparation of Siloxy/zirconium Butoxide Precursor

A siloxy/zirconium butoxide hybrid composition was prepared using methyltrimethoxysilane as the siloxy component and zirconium butoxide as the metal oxide component as follows:

A mixture of 0.88 grams of aq. 0.1 wt % hydrochloric acid and 5.13 grams of tetrahydrofuran was added dropwise to a mixture of 4.08 grams of methyltrimethoxysilane and 10 grams of methylisobutylketone in a 3-necked flask cooled with an ice bath with vigorous stirring under a dry atmosphere. The mixture was allowed to warm to room temperature and then heated to 60° C. for 3 hours. Subsequently, a mixture of 80 wt % 6.166 grams of zirconium in butoxide and 12.8 grams of tetrahydrofuran was added dropwise over a period of 30 minutes. After addition of 18.0 grams of tetrahydrofuran, the mixture was stirred at 60° C. for 3 hours and then cooled to room temperature before being used in fabricating the dielectric layer 2) Fabrication and Characterization of Thin Film Transistors A dielectric layer was prepared from the above siloxy/zirconium butoxide hybrid composition in accordance with the procedure of Example 1. The capacitance of the resulting dielectric layer, which had a thickness of 170 nanometers, was measured to be 25 $nF/cm^2$, and the dielectric constant was calculated to be 4.8. Thin film transistors were fabricated using the same procedure as in Example 1, except that the siloxy/zirconium butoxide hybrid composition was used in fabricating the dielectric layer. Thin film transistors with channel lengths of about 60 micron and channel widths of about 1000 microns were characterized by measuring the output and transfer curves. The devices turned on at around 0 volts and exhibited field-effect mobility of 0.1 $cm^2/V \cdot s$, and current on/off ratio of about 10,000.

The above illustrative examples show that the siloxy/metal oxide hybrid compositions of the present invention are useful in fabricating dielectric layers for thin film transistors. The dielectric layers prepared from a siloxy/metal oxide hybrid composition in accordance with the present disclosure enable fabrication of thin film transistors with highly desirable performance characteristics. The present siloxy/metal oxide hybrid compositions are solution processable and can be utilized in fabricating dielectric layers for low-cost flexible thin film transistors using solution deposition processes.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A thin film transistor comprising:
   a gate electrode;
   a dielectric layer prepared from a siloxy/metal oxide hybrid composition, the hybrid composition comprising a siloxy component and a metal oxide component;

the siloxy component being selected from the group consisting of siloxanes, silsesquioxanes, and combinations thereof;

the metal oxide component comprising a metal and an oxygen component;

the metal being selected from the group consisting of titanium, aluminum, zirconium, hafnium, tantalum, strontium, yttrium, lanthanum and combinations thereof; and the oxygen component being selected from the group consisting of oxygen, methoxy, ethoxy, propoxy, isopropoxy, butoxy, tert-butoxy, sec-butoxy, phenoxy and combinations thereof;

the siloxy component being present in the siloxy/metal oxide hybrid composition in an amount of from about 5 to about 95 percent by weight, and the metal oxide component being present in an amount of about 5 to about 95 percent by weight excluding the amounts of solvents that may be present in the siloxy/metal oxide hybrid composition;

a source electrode;

a drain electrode; and a semiconductor layer;

wherein said dielectric layer has a dielectric constant of greater than about 3.0 and has a surface roughness of less than about 1 nm.

2. The thin film transistor according to claim 1, wherein the siloxy component is a silsesquioxane selected from the group consisting of unsubstituted and substituted silsesquioxanes.

3. The thin film transistor according to claim 1, wherein the dielectric layer has a dielectric constant is greater than about 4.0.

4. A dielectric layer prepared from a siloxy/metal oxide hybrid composition, the siloxy/metal oxide hybrid composition comprising a siloxy component in an amount of from about 5 to about 95 percent by weight and a metal oxide component in an amount of from about 5 to about 95 percent by weight, such that the combined amount of the siloxy and metal oxide components equals 100 percent by weight excluding the amounts of solvents that may be present in the siloxy/metal oxide hybrid composition, the siloxy component being selected from the group consisting of siloxanes, silsesquioxanes and combinations thereof, wherein the dielectric layer has a dielectric constant of about 3 or greater and has a surface roughness of less than about 1 nm.

5. The dielectric layer of claim 4, wherein the dielectric layer has a dielectric constant of about 4 or greater.

6. The dielectric layer of claim 4, wherein the dielectric layer has a dielectric constant of about 6 or greater.

* * * * *

UNITED STATES PATENT AND TRADEMARK OFFICE
CERTIFICATE OF CORRECTION

PATENT NO. : 7,755,081 B2
APPLICATION NO. : 11/558015
DATED : July 13, 2010
INVENTOR(S) : Yiliang Wu et al.

Page 1 of 1

It is certified that error appears in the above-identified patent and that said Letters Patent is hereby corrected as shown below:

In the Specifications:

Column 1, line 17 after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*